United States Patent [19]
Elliott

[11] Patent Number: 5,213,349
[45] Date of Patent: May 25, 1993

[54] ELECTROSTATIC CHUCK

[76] Inventor: Joe C. Elliott, 519 Spring St., Redwood City, Calif. 94063

[21] Appl. No.: 809,756

[22] Filed: Dec. 18, 1991

[51] Int. Cl.⁵ .............................................. H02N 13/00
[52] U.S. Cl. ...................................... 279/128; 269/8; 361/234
[58] Field of Search ................. 279/128, 1 M; 269/8; 361/234

[56] References Cited

U.S. PATENT DOCUMENTS

| | | | |
|---|---|---|---|
| 4,184,188 | 1/1980 | Briglia | 361/234 |
| 4,502,094 | 2/1985 | Lewin et al. | 361/234 |
| 4,520,421 | 5/1985 | Sakitani et al. | 361/234 |
| 4,864,461 | 9/1989 | Kasahara | 361/234 |
| 4,999,507 | 3/1991 | Clemens et al. | 361/234 X |
| 5,055,964 | 10/1991 | Logan et al. | 279/128 X |

Primary Examiner—Steven C. Bishop
Attorney, Agent, or Firm—Intellectual Property Law Center

[57] ABSTRACT

An electrostatic chuck for clamping a substrate during manufacture thereof. The chuck has an electrostatic plate and a support therefor. The electrostatic plate has a top surface, which contacts the substrate, and which has an inner coil portion and an outer coil portion for connection to a DC source for forming an electric field. Heat in the substrate is removed by the plate. The plate has a plurality of selectively placed chambers and passages for removing heat by gas circulation therethrough.

4 Claims, 18 Drawing Sheets

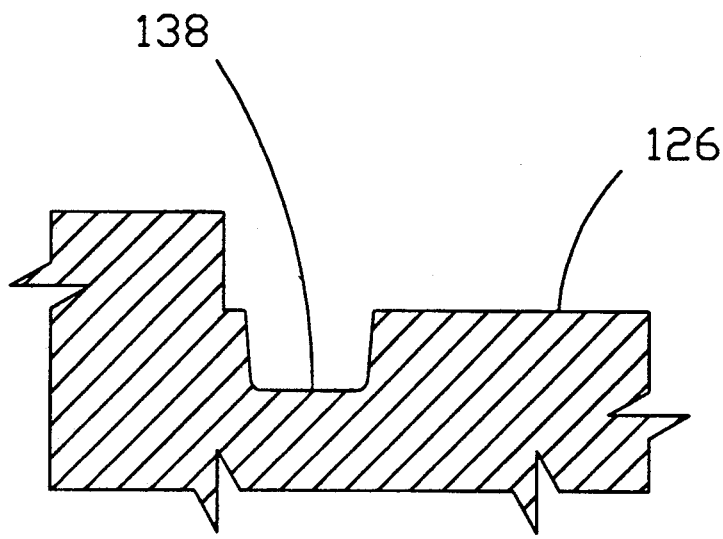
FIG._16

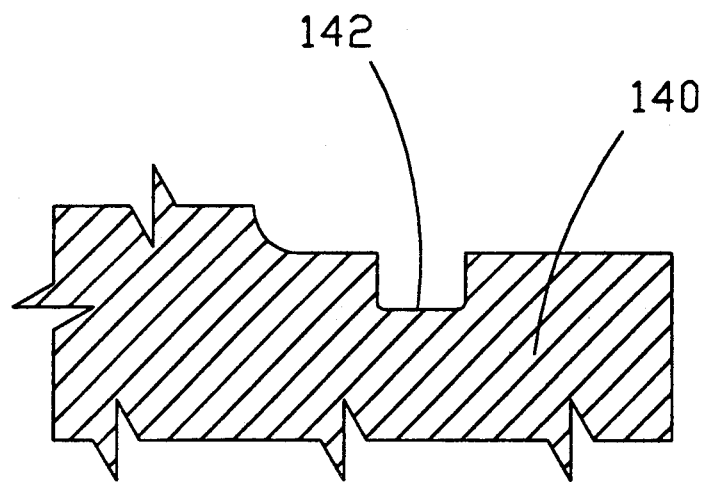
FIG._17

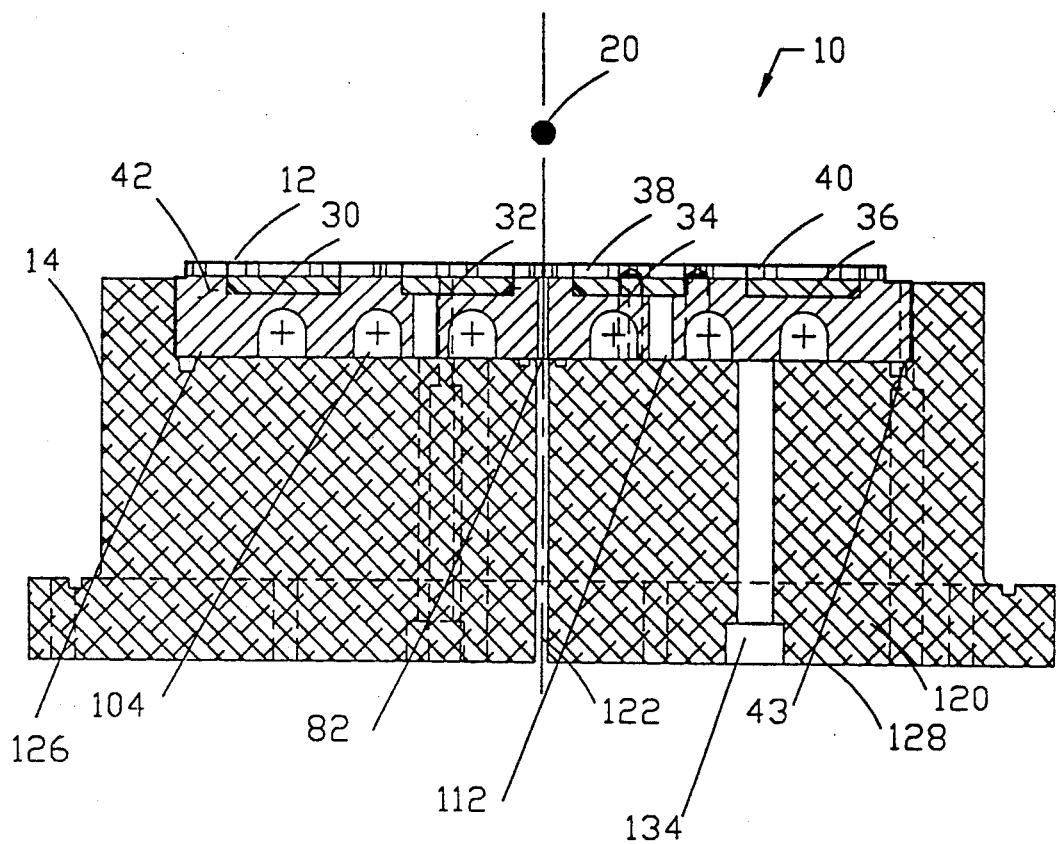
FIG._18

ELECTROSTATIC CHUCK

The invention generally relates to an electrostatic chuck, and in particular the invention relates to an electrostatic substrate chuck having a combination electrostatic clamping and fluid cooling plate.

BACKGROUND OF THE INVENTION

The prior art electrostatic chuck is described in U.S. Pat. No. 4,184,188, issued Jan. 15, 1980. Related patents included U.S. Pat. Nos. 4,949,783, issued Aug. 21, 1990 and 4,864,461, issued Sep. 5, 1989. A related publication is Wardly Electrostatic Wafer Chuck for Electron Beam Microfabrication, 1506 Rev. Sci. Instrum., Vol. 44, No. IV, October 1973.

The prior art electrostatic chuck includes a water cooled bottom plate, an electrostatic plate supported by the water cooled bottom plate, and a printed circuit capacitor supported by the electrostatic plate and two sets of electrodes disposed on the electrostatic plate and two sets of electrodes disposed on the bottom silicone layer and a top silicone layer disposed on the two sets of electrodes, whereby an electrostatic field can be formed for clamping a substrate to the electrostatic plate and whereby heat is conducted from the wafer to the water cooled plate.

One problem with the prior art electrostatic chuck is that the operating voltage for forming a suitable chuck electrostatic field is relatively high.

SUMMARY OF THE INVENTION

According to the present invention, an electrostatic chuck is provided. This chuck comprises an electrostatic clamping and fluid cooling plate for clamping and cooling a substrate, and a support for the plate, said plate having a top inner coil portion and a top outer coil portion with respective connections to a DC source for forming an electrostatic field for clamping a substrate to the plate during manufacture of the substrate, said plate having a main body portion connected to the inner coil portion and to the outer coil portion and respectively forming an inner circular chamber and an outer circular chamber under the inner coil portion and the outer coil portion, said main body portion having a bottom surface forming a main fluid chamber together with the support, said inner coil portion and said outer coil portion having respective electrical insulation separators for electrical insulation from the main body portion, said support and said plate main body portion having gas passages for flow of gas through the chambers. The gas is preferably helium, but argon or nitrogen may be used.

By using the inner core portion and outer coil portion, the operating voltage for forming a suitable chuck electrostatic field is minimized. By using the plate subassembly which has gas flow chambers and passages, the thermal conduction is more effective. The gas acts as a thermal media making a thermal connection between the chuck and a substrate.

One object of the present invention is to provide an electrostatic chuck which has a plate that has an inner coil and an outer coil for forming its electrostatic field that uses a minimized operating voltage.

Another object is to provide an electrostatic chuck which has an electrostatic field forming plate that has integral gas chambers and passages for maximized heat removal.

The foregoing and other objects, features and advantages will be apparent from the following description of the preferred embodiment of the invention as illustrated in the accompanying drawings.

BRIEF DESCRIPTION OF THE DRAWINGS

FIG. 16 is a section view as taken along the line 16—16 of FIG. 13;

FIG. 17 is a section view as taken along the line 17—17 of FIG. 13; and

FIG. 18 is a section view of the assembly of the chuck.

DESCRIPTION OF PREFERRED EMBODIMENT

Figure 1:
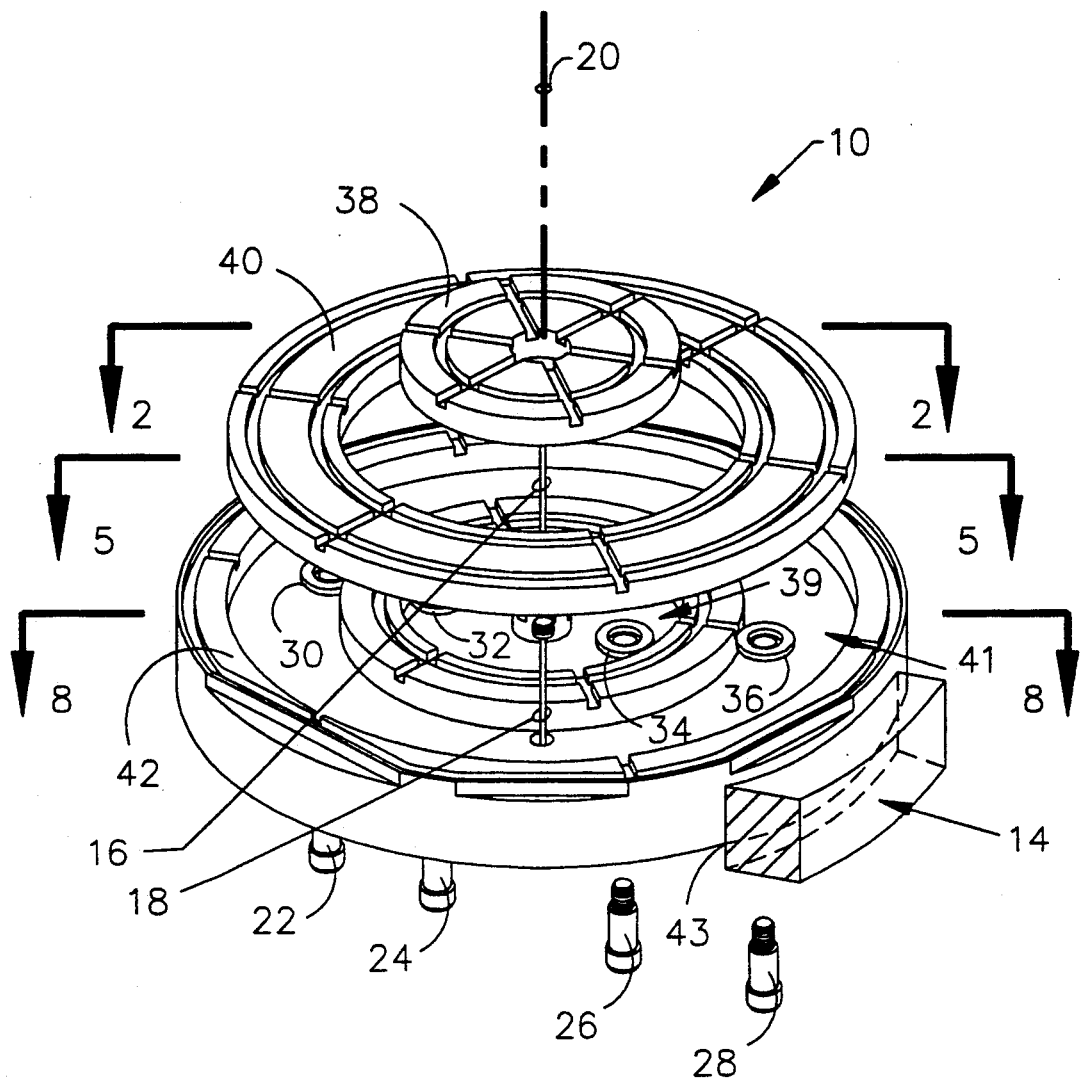
FIG. 1 is an exploded perspective view of an electrostatic chick according to this invention.

As shown in FIG. 1, an electrostatic chuck or clamp or fixture or device 10 is provided. Chuck 10 includes a three-piece puck shaped plate assembly or subassembly 12, and a bottom support 14.

As shown in FIGS. 2-11, subassembly 12 creates an electrostatic field when energized, in order to clamp thereto a substrate (not shown) during the substrate manufacture. Subassembly 12 and support 14 are connected by three bolts (not shown) and are coaxially aligned along a chuck axis 20.

Plate subassembly 12 includes an inner coil portion or inner coil 38, which forms a top wall of a circular or doughnut-shaped inner chamber 39, and includes an outer coil portion or outer coil 40 which forms bottom wall of chamber 41. A third chamber 43 is also formed between subassembly 12 and support 14. As explained hereafter passages interconnect chamber 39, 41 to chamber 43, after assembly of inner coil 38 and outer coil 40 to main body 42.

Figure 2:
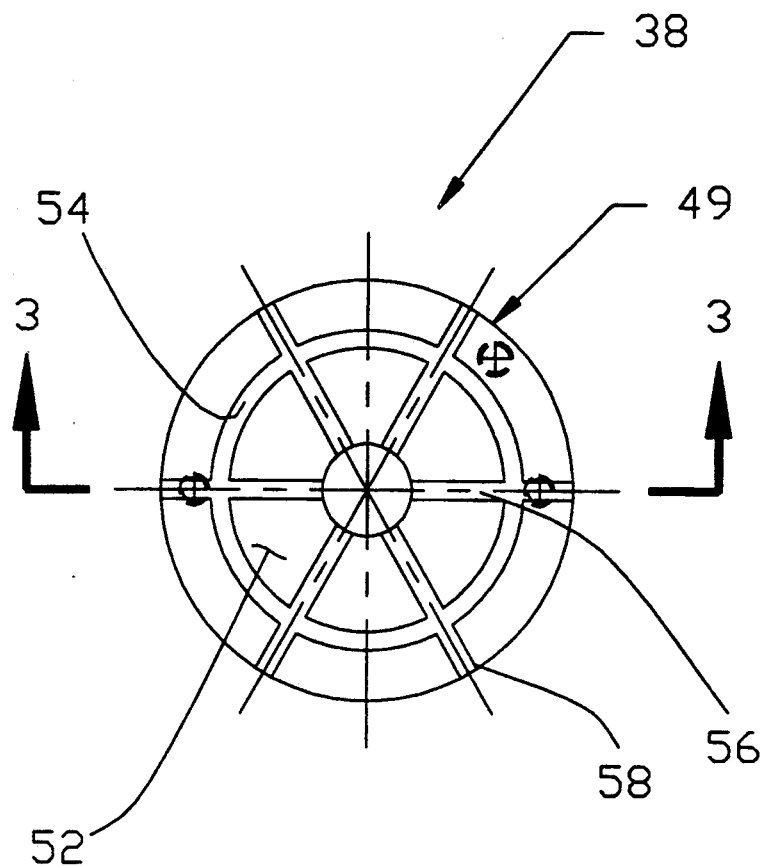
FIG. 2 is a section view as taken along the line 2—2 of FIG. 1.
Figure 3:
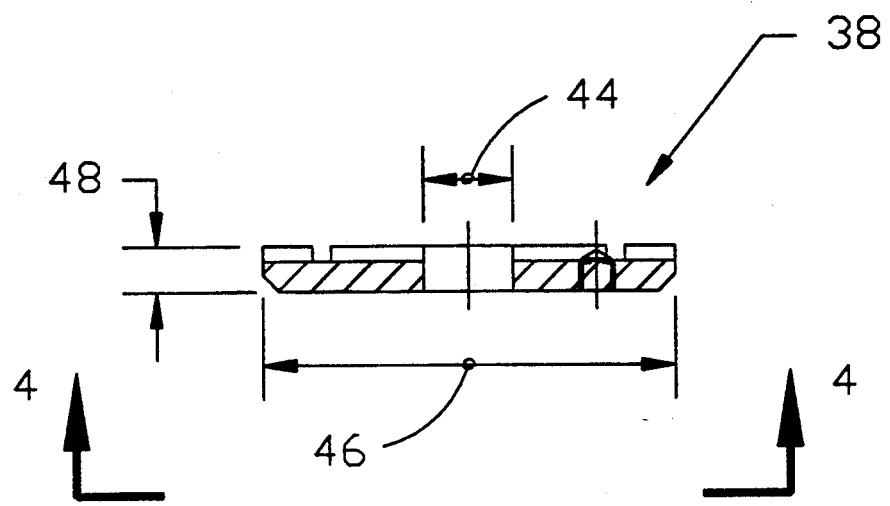
FIG. 3 is a section view as taken along the line 3—3 of FIG. 2.
Figure 4:
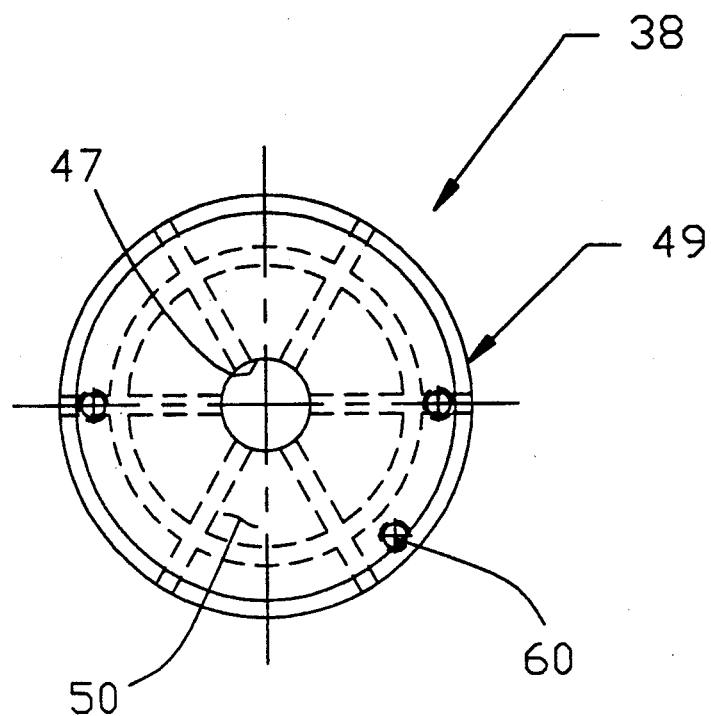
FIG. 4 is an elevation view as taken along the line 4—4 of FIG. 3.

As shown in FIGS. 2, 3, 4, inner coil 38 has an inner diameter of 44 of about 0.500 inches in this embodiment, and has an outer diameter 46 of about 2.250 inches, and a thickness 48 of about 0.240 inches. Inner coil 38 also has two peripheral surfaces 47, 49, which have an electrical insulating coat or joint filler (not shown). Inner coil 38 also has a bottom surface 50 and a top surface 52. Top surface 52 has a ring groove 54 and has six inner radial slots 56 and has six outer radial slot 58. Slots 56,58 are respectively in radial alignment, in pairs, and have an equiangular spacing. Slots 56, 58 are respectively disposed at angles of 30 degrees, and 330 degrees, thereby forming selectively shaped surface portions therebetween. Bottom surface 50 has three inner taped holes 60, on about 0.938 inch radius, with about a 0.120 inch hole diameter, and at angles of about 90 degrees, 135 degrees, and 270 degrees.

Figure 5:
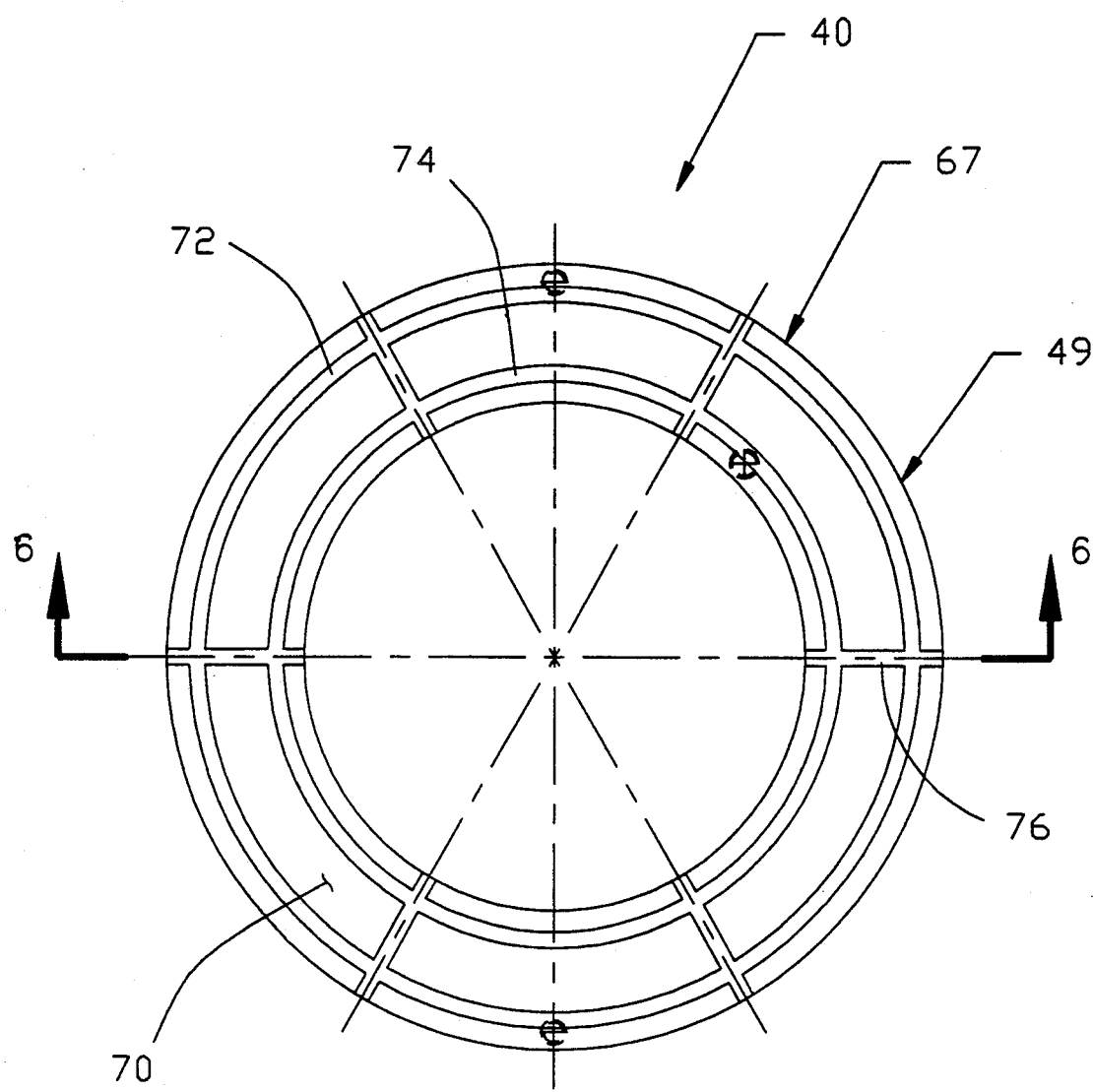
FIG. 5 is a section view as taken along the line 5—5 of FIG. 1.
Figure 6:
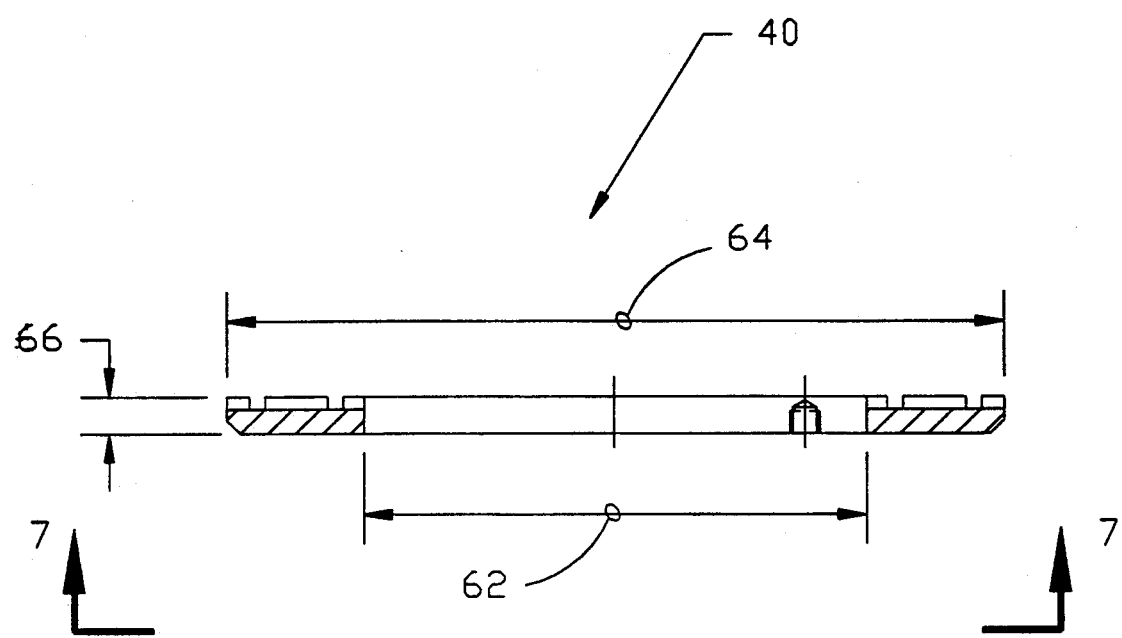
FIG. 6 is a section view as taken along the line 6—6 of FIG. 5.
Figure 7:
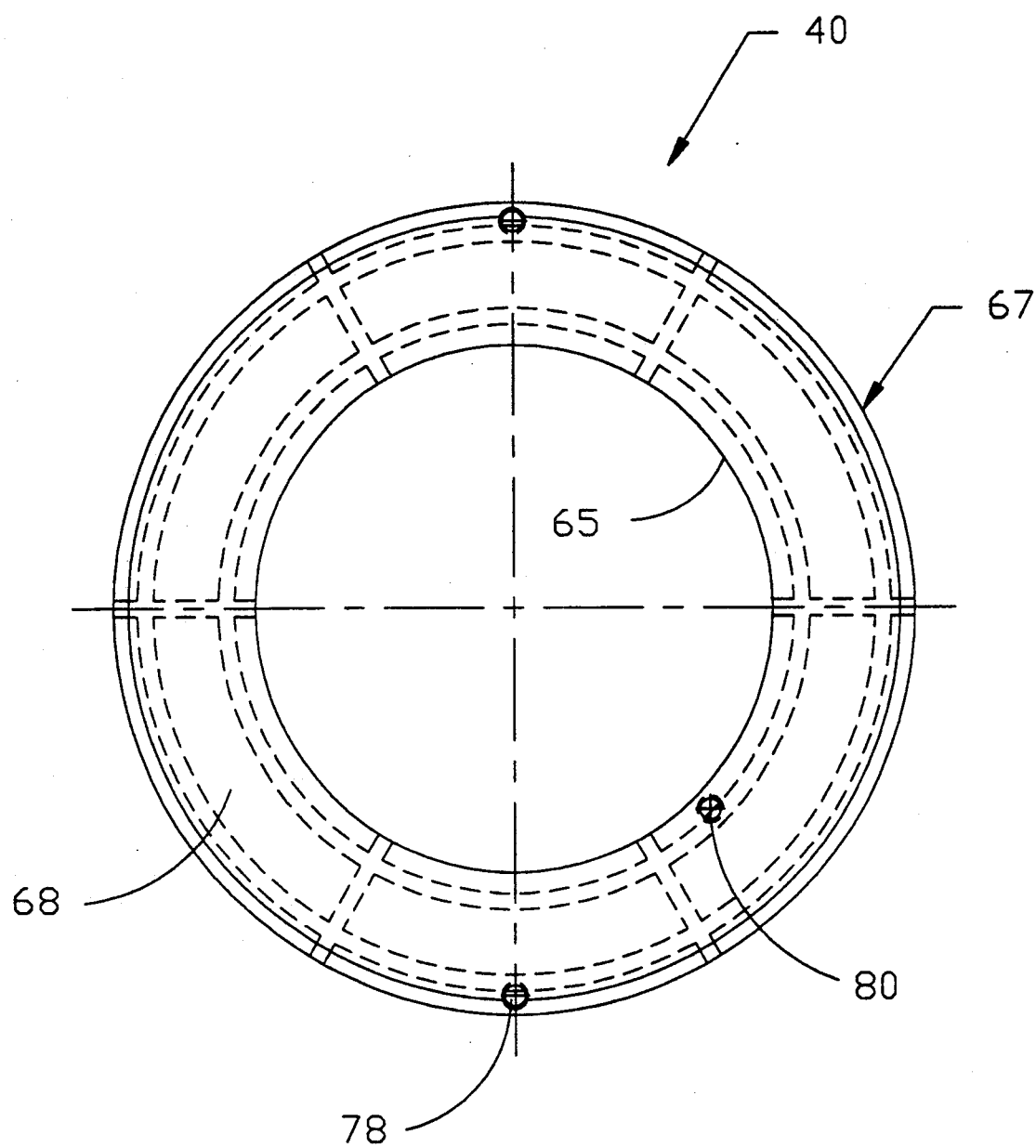
FIG. 7 is an elevation view as taken along the line 7—7 of FIG. 6.
Figure 8:
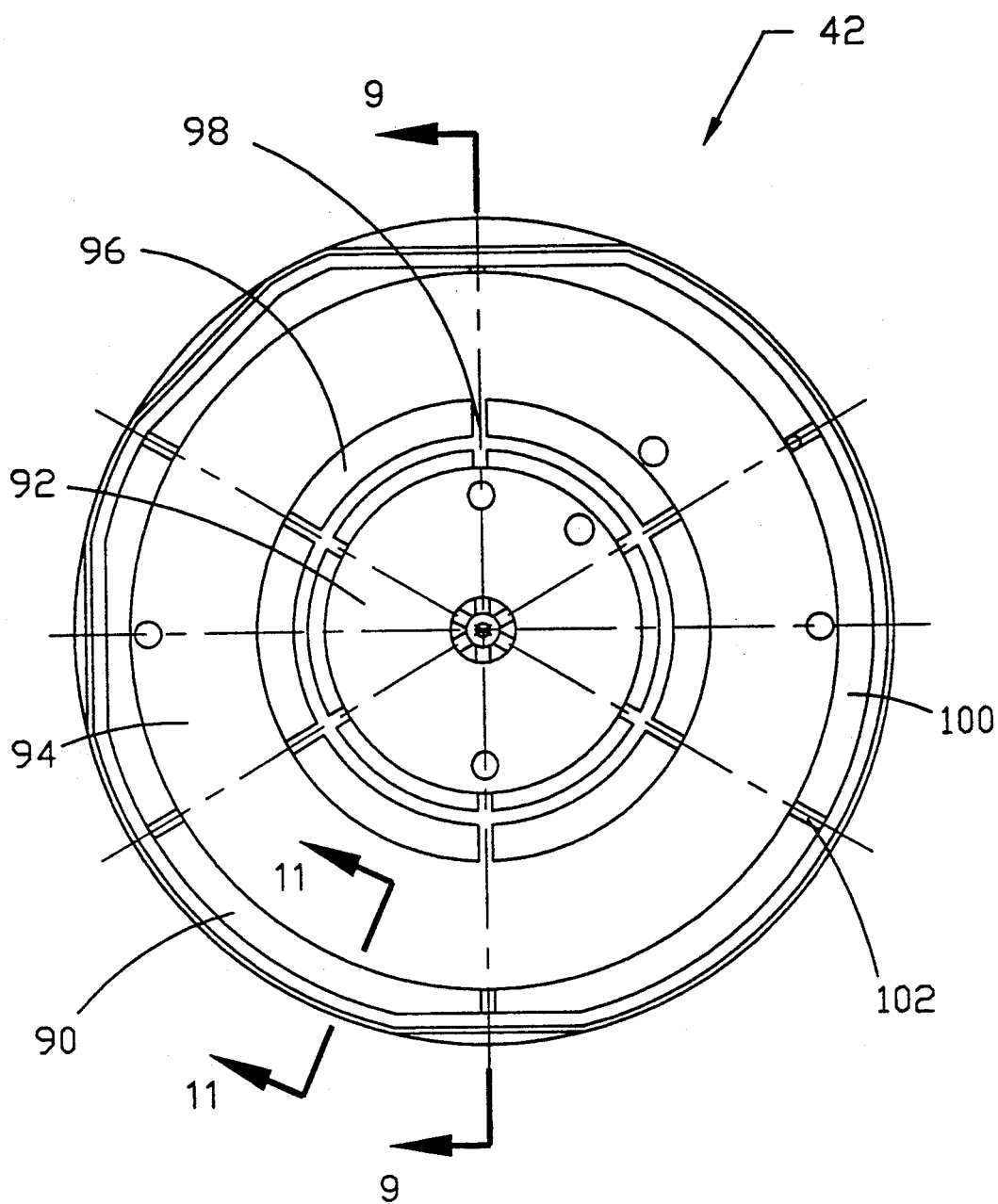
FIG. 8 is a section view as taken along the line 8—8 of FIG. 1.
Figure 9:
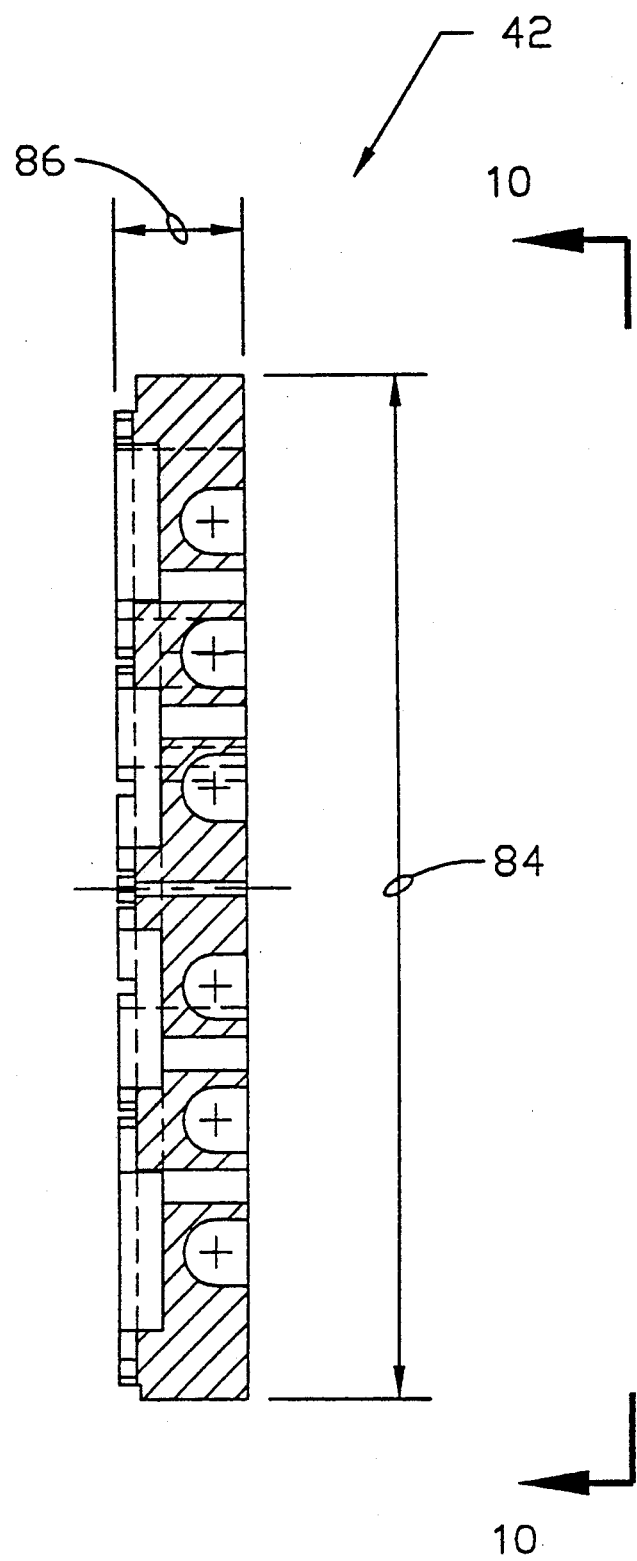
FIG. 9 is a section view as taken along the line 9—9 of FIG. 8.
Figure 10:
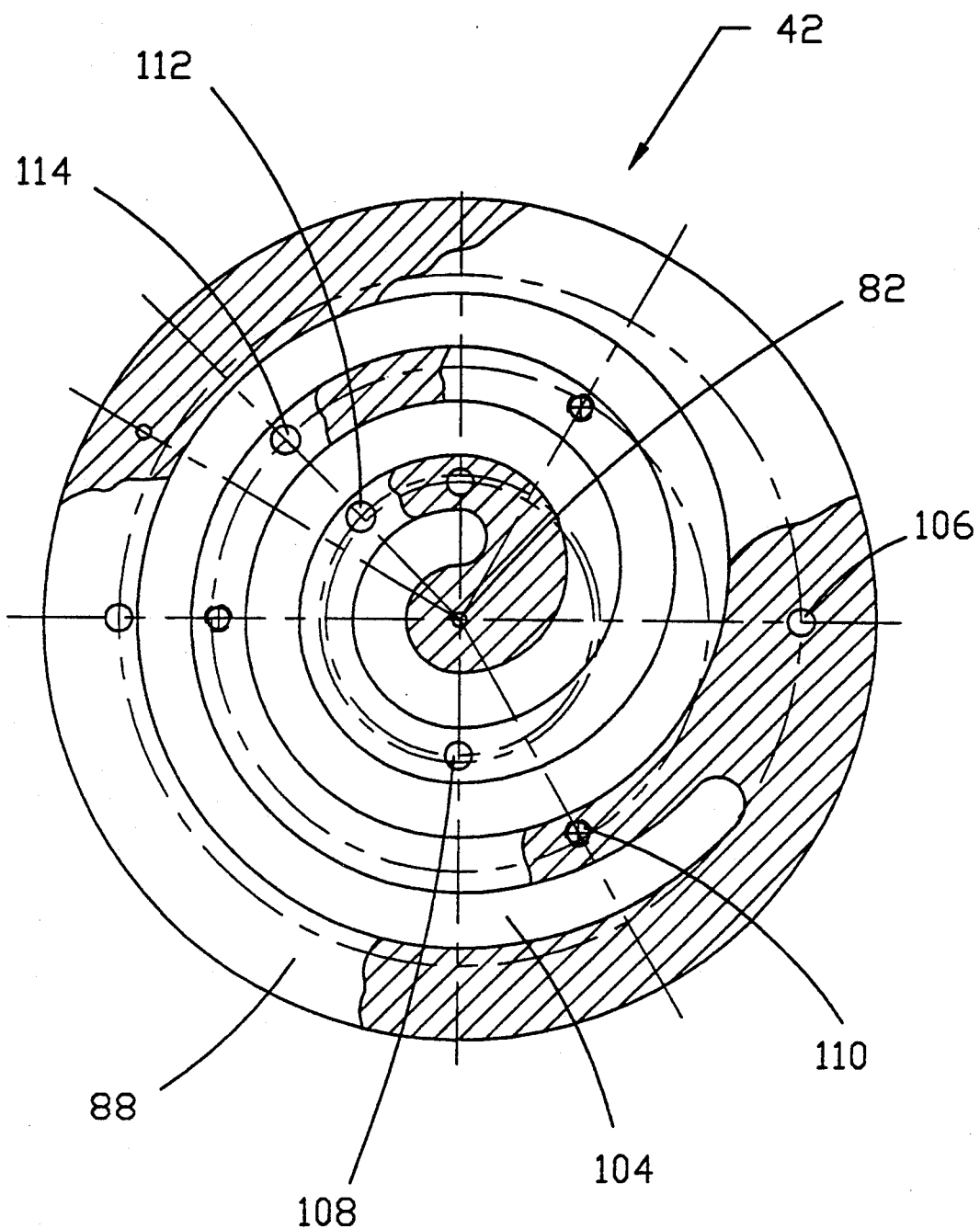
FIG. 10 is an elevation view as taken along the line 10—10 of FIG. 9.
Figure 11:
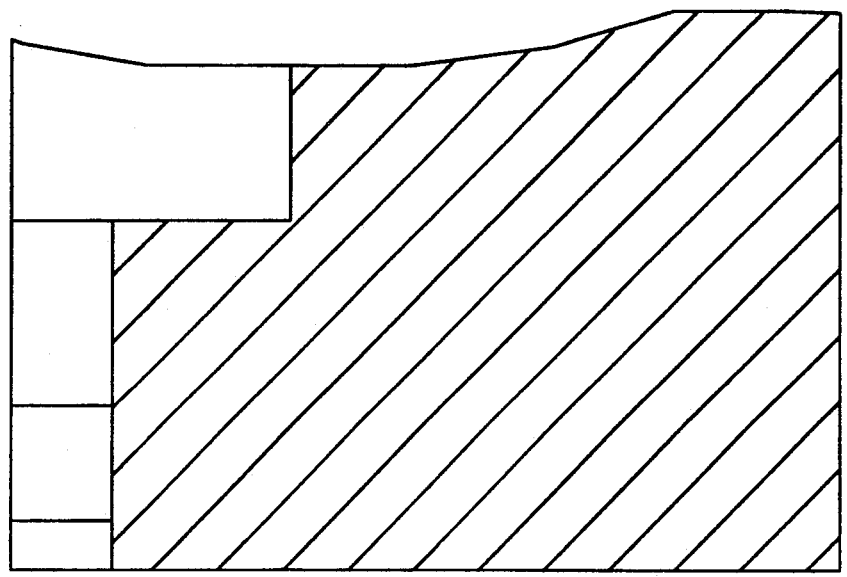
FIG. 11 is an enlarged view as taken along the line 11—11 of FIG. 8.
Figure 12:
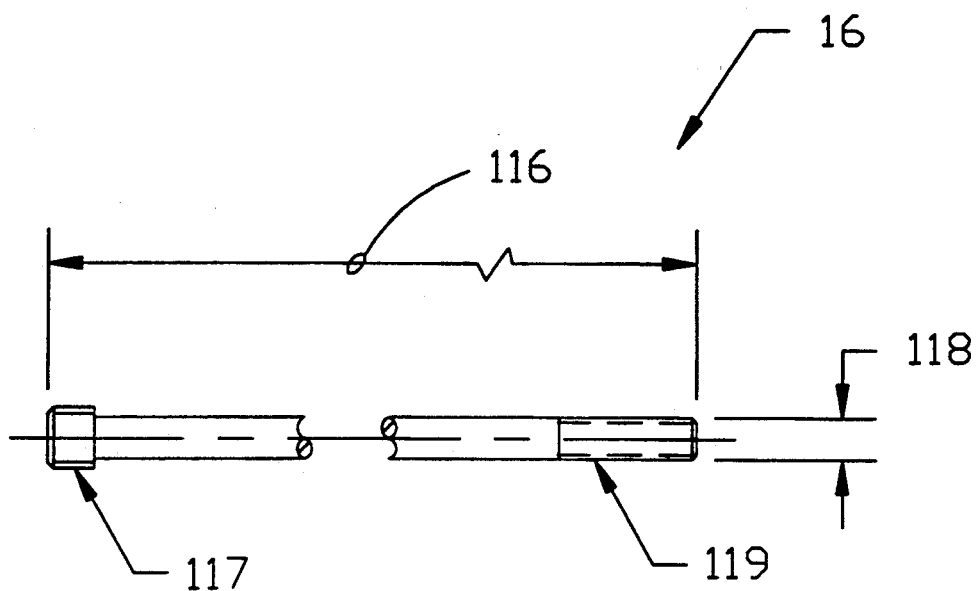
FIG. 12 is a detail view of a portion of FIG. 1.
Figure 13:
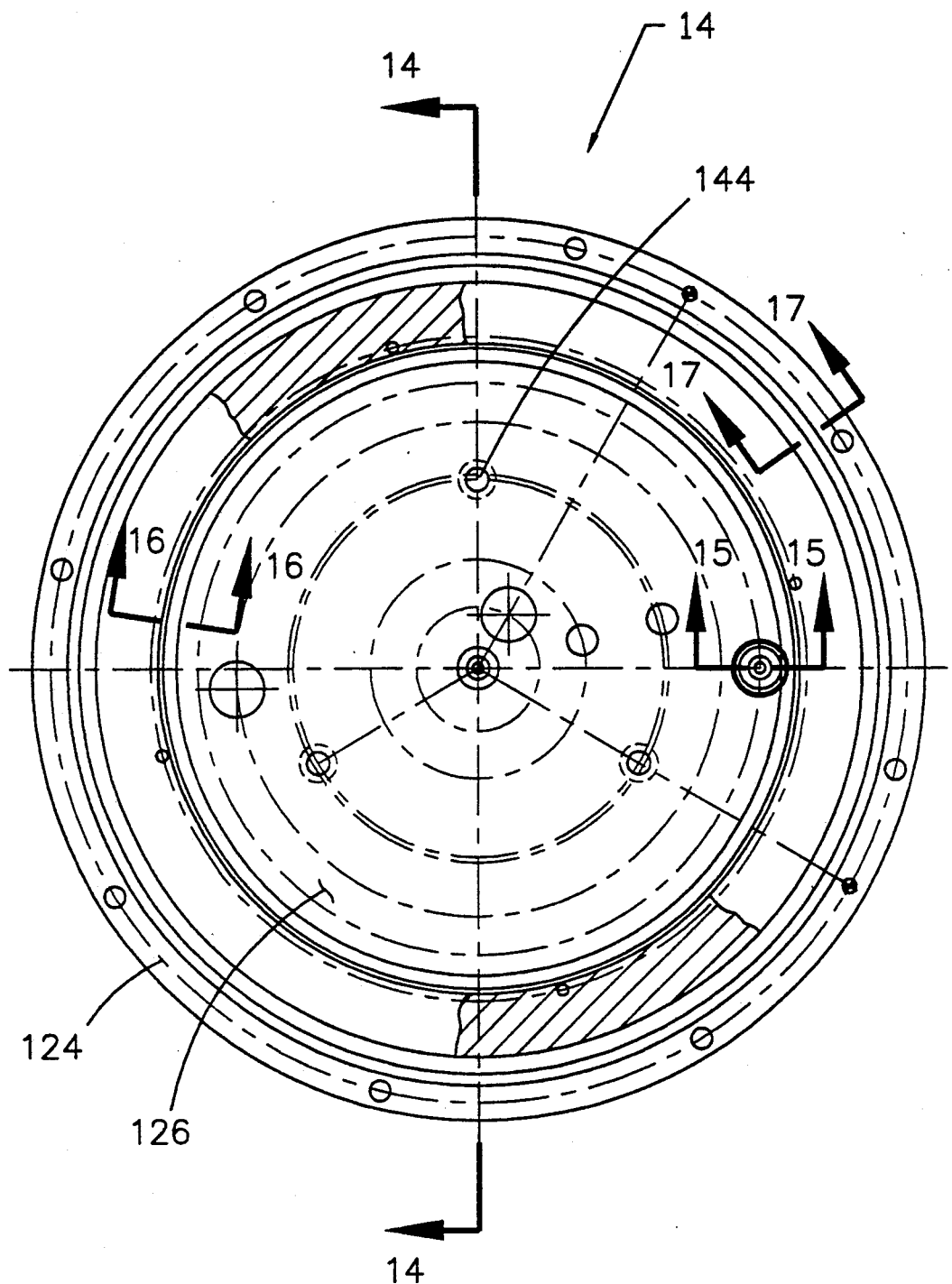
FIG. 13 is a top plan view of a support member as shown in FIG. 1.
Figure 14:
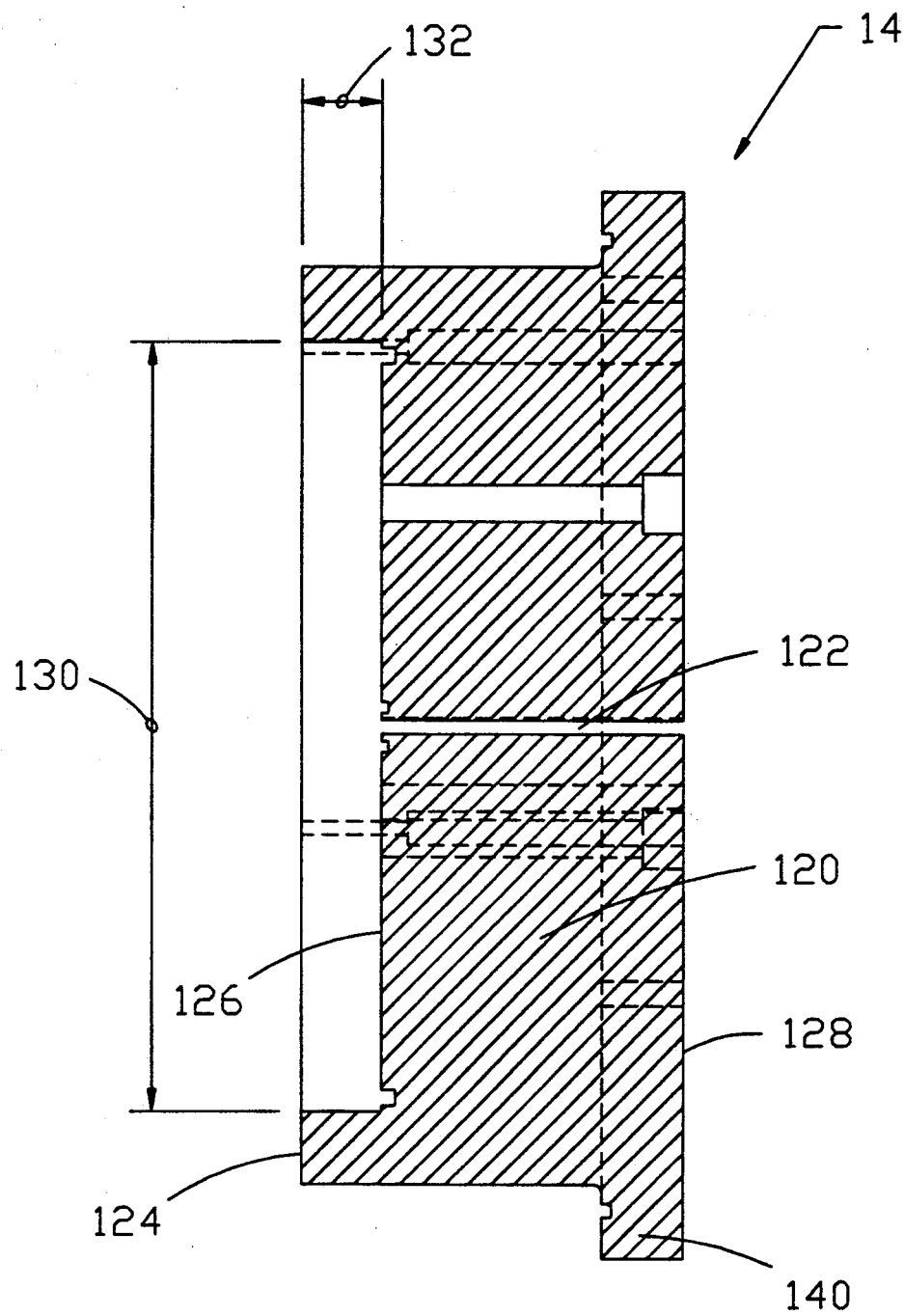
FIG. 14 is a section view as taken along the line 14—14 of FIG. 13.

As shown in FIGS. 5, 6, 7, outer coil 40 has an inner diameter 62 of about 3.240 inches in this embodiment, and has an outer diameter 64 of about 5.000 inches, and a thickness 66 of about 0.240 inches. Outer coil 40 also has two peripheral surfaces 65, 67 which have an electrical insulating coat or joint filler (not shown). Outer coil 40 also has a bottom surface 68 and a top surface 70. Top surface 70 has an outer ring groove 72 of about 4.500 inch diameter, and has an inner groove ring 74 of about 3.700 inch diameter, and has six radial interconnect slots 76. Slots 76 are disposed at angles of about 30 degrees, ninety degrees 150 degrees, 210 degrees, 270 degrees and 330 degrees. Bottom surface 68 has two outer tapped holes 78 on about 4.740 inch diameter at angles of 0 degrees and 180 degrees. Bottom surface 68 also has one other outer tapped hole 80 on a smaller diameter and at 135 degree angle and of 0.120 inch diameter hole size.

As shown in FIGS. 8 through 11, main body 42 has a center hole 82 of about 0.100 inch hole diameter for gas passage, and has an outer diameter 84 on about a 5.780 inch diameter, and has a thickness 86 of 0.740 inches. Main body 42 also has a bottom surface 88 and has a top surface 90. Top surface 90 has an outer ring-shaped recess 94 for receiving outer coil 40, and has an inner ring-shaped recess 92 for receiving inner coil 38. Top surface 90 also has an inner ring-shaped portion or projection 96, which is disposed between recesses 92, 94. Projection 96 has six outer radial slots 102. Slots 98, 102 are radially aligned, in pairs, at angles of 0 degrees, 60 degrees, 120 degrees, 180 degrees, 240 degrees, and 300 degrees. Bottom surface 88 has a spiral groove 104, and has two outer holes 106 at angles of 0 degrees and 180 degrees, and has three intermediate holes 110 at angles of 30 degrees, 150 degrees and 270 degrees, and has two radially aligned holes 112, 114 at an angle of 315 degrees.

Screw 16, which is identical to screw 18, has a length 116 of about 3.951 inches and has a head portion 117, and has a threaded end portion 119.

As shown in FIGS. 13-17, support 14 has a wall 120, which has a center hole 122. Wall 120 has a top surface 124, which has a recess 126, and has a bottom surface 128. Recess 126 has an inner diameter 130 of about 5.810 inches, and has a depth 132 of about 0.620 inches.

Figure 15:
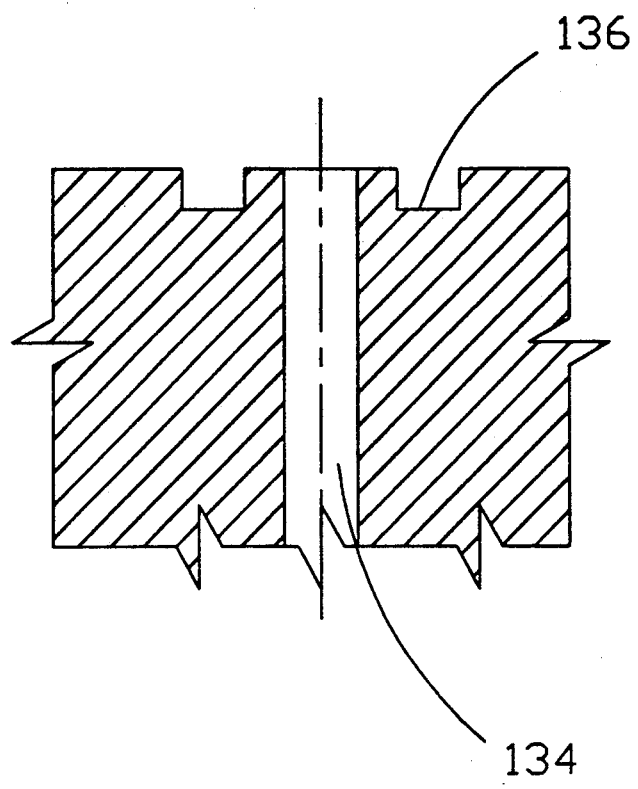
FIG. 15 is a section view as taken along the line 15—15 of FIG. 13.

As shown in FIG. 15, recess 126 has two holes 134 with a hole diameter of 0.100 inch, on a 4.392 inch diameter, at angles of 90 degrees and 270 degrees. Each hole 134 has a concentric groove 136. As shown in FIG. 16, recess 126 has a ring groove 138. As shown in FIG. 17, wall 120 has a projection 140 which has a ring groove 142. Recess 126 also has three holes 144 on a 3.370 inch diameter at angles of 0 degrees, 120 degrees and 240 degrees.

As shown in FIG. 18, the method of assembly of parts 38, 40 and 42 of subassembly 12 is indicated hereafter.

First, thread screw 16 into inner coil 38 and thread screw 18 into outer coil 40.

Second, insert shoulder bolts 22, 24, 26, 28 through clearance holes 106, 108, and install wafers 30, 32, 34, 36 on respective bolts 22, 24, 26, 28.

Third, bed or dip coils 38, 40 into epoxy adhesive for filling ring-shaped joints or gaps with epoxy adhesive.

Fourth, place coils 38, 40 in their respective pockets or recesses 92, 94.

Fifth, tighten shoulder bolts 22, 24, 26, 28 until coils 38, 40 touch their respective pairs of wafers 32, 34 and 30, 36.

Sixth, cure subassembly adhesive in an oven for about two hours at a selective oven temperature.

As shown in FIG. 18, the method of assembly of the aforedescribed subassembly 12 and the support 14 is indicated hereafter.

First, place subassembly 12 into recess 126 of support 14 after placing seal rings in grooves 136 and 138.

Second, orient subassembly 12 about axis 20 relative to support 14 until holes 144 are aligned; and tighten tapped bolts in holes 144.

The materials of chuck 10 are indicated hereafter: a) Subassembly parts 38, 40, 42, and support 14, are made of a metal such as an anodized aluminum alloy;

b) Washers 30, 32, 34, 36 are made of an electrically insulating material of a selective type to suit its bearing stresses and other requirements, such as a plastic material or a ceramic material, for forming bearing resistant separators;

c) The joints (not shown) adjacent to the inner and outer diameters 44, 46 of inner coil 38 and the inner and outer diameters 62, 64 of outer coiled 40, are made of a selective material, such as a curable adhesive material, or a like electrically insulating filler material, for forming the four insulating rings;

d) Shoulder bolts 22, 24, 26, 28 are removable metal shoulder bolts for assembly of the plate parts 38, 40, 42. This embodiment of chuck 10 approximately meets the specification as indicated hereafter;

a) Wafer size: 200 mm, 150 mm, 125 mm or 100 mm;
b) Temperature range: $-60°$ C. to $180°$ C.;
c) Cooling gas pressure: 8 torr max;
d) Typical gas flow: 10 to 20 sccm;
e) RF electrode voltage: 200 pk volts max; and
f) Vacuum compatibility: to $1.6 \times 10^{-7}$ torr.

This embodiment of chuck 10 has the features and benefits as indicated hereafter:

a) It is an integral unit with adaptor flange; therefore, it is easy to change chuck 10 to suit a new wafer size;

b) It has low temperature compatibility; therefore provides a cold chuck application;

c) It has a low rate of flow of gas, and may use helium, argon or nitrogen; therefore, it does not interfere with existing process of manufacture;

d) It uses up to 8 torr backside pressure; therefore, it provides efficient temperature control of wafer;

e) RF provision; therefore, it is adapted to integrate to a reactor of an existing system; and f) Low pressure compatibility; therefore, it has multiple applications.

The advantages of chuck 10 are indicated hereafter:

a) The voltage for forming a suitable electrostatic field is minimized as compared to the prior art electrostatic chuck;

b) The chuck 10 has a single plate assembly for forming the electrostatic field, and having chambers and passages for cooling the clamped substrate during manufacture;

c) The electrostatic field is uniform in value across the surface of the plate unit 12, thereby minimizing the required voltage;

d) The electrostatic field causes clamping of the substrate to the plate unit 12, from the substrate center radially outwardly to the substrate peripheral edge, thereby preventing edge damage to the substrate;

e) Sealing of the cooling system is facilitated; and f) Chuck 10 has no moving parts, thereby reducing wear and gas leakage.

While the invention has been described in its preferred embodiment, it is to understood that the words which have been used are words of description rather than of limitation and that changes may be made within the purview of the appended claims without departing from the true scope and spirit of the invention in its broader aspects. For example, chuck 10 or support 14 can have a conventional lift pin mechanism for robotic handling of the wafer.

What is claimed is:

1. An electrostatic chuck comprising:
   an electrostatic clamping and gas cooling plate; and
   a support for the plate;
   said plate having a top inner coil portion and a top outer coil portion which can be respectively connected to a DC source for forming an electrostatic field for clamping a substrate to the plate during manufacture of the substrate;
   said plate having a main body portion mechanically connected to the inner coil portion and to the outer coil portion and respectively forming an inner chamber and an outer chamber disposed under the inner coil portion and the outer coil portion;
   said main body portion having a bottom surface forming together with the support a main chamber; and
   said support and said plate having a plurality of passages interconnecting the inner chamber and the outer chamber and the main chamber for flow therethrough of gas.

2. The chuck of claim 1, wherein
   the inner coil portion has an inner peripheral surface and an outer peripheral surface for forming respectively an inner joint and an outer joint for respective electrical insulating filler rings; and
   the outer coil portion has an inner peripheral surface and an outer peripheral surface for forming respectively an inner joint and an outer joint for respective electrical insulating.

3. The chuck of claim 1, wherein
   the inner coil portion has an inner top surface;
   the outer coil portion has an outer top surface; and
   said top surfaces each have a plurality of radial slots and a ring groove.

4. The chuck of claim 3, wherein
   said inner coil portion and said outer coil portion each has an inner diameter and an outer diameter and a ring-like shape; and
   said main body portion has a top surface having an inner ring-shaped recess receiving the inner coil portion and has an outer ring-shaped recess receiving the outer coil portion.

* * * * *